(12) United States Patent
Abbasi et al.

(10) Patent No.: US 11,356,186 B1
(45) Date of Patent: Jun. 7, 2022

(54) SYSTEMS AND METHOD FOR CALIBRATING A RADIO TRANSCEIVER

(71) Applicant: Sequans Communications SA, Colombes (FR)

(72) Inventors: Arash Abbasi, Reading (GB); Bertrand Debray, Maisons-Lafitte (FR)

(73) Assignee: Sequans Communications SA, Colombes (FR)

( * ) Notice: Subject to any disclaimer, the term of this patent is extended or adjusted under 35 U.S.C. 154(b) by 0 days.

(21) Appl. No.: 17/207,341

(22) Filed: Mar. 19, 2021

(51) Int. Cl.
*H04B 17/13* (2015.01)
*H04B 17/12* (2015.01)
*H04B 1/04* (2006.01)
*H04B 17/14* (2015.01)
*H03F 1/32* (2006.01)

(52) U.S. Cl.
CPC .......... *H04B 17/13* (2015.01); *H03F 1/3205* (2013.01); *H04B 1/0475* (2013.01); *H04B 17/12* (2015.01); *H04B 17/14* (2015.01)

(58) Field of Classification Search
CPC ..................................................... H04B 17/13
See application file for complete search history.

(56) References Cited

U.S. PATENT DOCUMENTS

| 7,259,569 | B2 | 8/2007 | Kim |
| 7,929,938 | B2 | 4/2011 | Sellars et al. |
| 8,676,145 | B2 | 3/2014 | Kaczman et al. |
| 9,276,620 | B2 | 3/2016 | Han et al. |
| 2006/0145706 | A1* | 7/2006 | Kim .......................... H03D 7/14 324/601 |
| 2007/0077907 | A1* | 4/2007 | Rector ................. H03D 7/1491 455/323 |
| 2011/0151792 | A1* | 6/2011 | Kushnir ................. H04B 1/109 455/63.1 |
| 2012/0306576 | A1* | 12/2012 | Paidi ....................... H03F 1/223 330/277 |
| 2014/0092946 | A1* | 4/2014 | Dhayni .............. H04B 17/0085 375/224 |
| 2014/0184301 | A1* | 7/2014 | Ro ....................... H03D 7/1441 327/359 |
| 2020/0021248 | A1* | 1/2020 | Wan ......................... H03F 1/30 |

FOREIGN PATENT DOCUMENTS

EP 2833547 A1 * 2/2015 ............ H03F 1/3211

* cited by examiner

*Primary Examiner* — Hsinchun Liao
(74) *Attorney, Agent, or Firm* — One LLP (57) ABSTRACT

Disclosed are example embodiments of methods and systems for calibrating the second and third order intermodulation intercept points of a radio transceiver. The calibration circuit comprises: a common mode voltage (VCM) calibration circuit having a complementary to absolute temperature (CTAT) voltage node coupled to one or more VCM nodes of the radio transceiver, wherein the VCM calibration circuit is configured to adjust the CTAT voltage to reduce a third-order intermodulation (IM3) at an output of the radio transceiver; and a bulk terminal calibration circuit configured to bias one of a VBP and VBN voltages at one or more bulk terminals of one or more transistors of the RF circuit to reduce a second-order intermodulation (IM2).

17 Claims, 6 Drawing Sheets

SYSTEMS AND METHOD FOR CALIBRATING A RADIO TRANSCEIVER

TECHNICAL FIELD

The disclosure relates generally to the field of wireless transceiver, specifically and not by way of limitation, some embodiments are related to passive mixer.

BACKGROUND

Direct-conversion receivers (DCRs) are vastly employed in modern wireless receivers thanks to the high-level of integration that they provide. However, there is a linearity concern in DRCs that needs to be taken into account by DRC designers. Improving the linearity of the receiver front-end to minimize intermodulation products is on the top priority as we are moving to more complex systems with multiple inputs and outputs, especially, in full-duplex operation mode, where there is a limited duplexer isolation. This puts a stringent linearity requirement in the early stages of the receiver chain due to the transmit signal leakage that is located very close to the desired signal frequency.

Previously, an off-chip surface acoustic wave (SAW) filter was utilized between the low-noise amplifier (LNA) and the mixer to suppress the out-of-band blockers and enhance linearity. However, this approach increases both the bill of materials and the design complexity. In this regard, down-conversion mixer with a reliable calibration technique plays a significant role in maintaining both even-order and odd-order linearity performances.

In fact, double-balanced passive mixers, with differential input and output, are well-known for their high linearity. However, the linearity performances degrade over temperature and process corners. Moreover, device mismatches generate imbalance in differential circuits and cause even-order non-linearity after fabrication. In the past, a wide range of research has been done to improve the second-order linearity performance of the passive mixer. However, calibrated second-order linearity in the room temperature degrades over wide temperature range such as −30-105 degree Celsius. Accordingly, what is needed is a calibration methodology that improves both second- and third-order linearity performance in each process corner, where the performances are maintained over temperature variations.

SUMMARY

Disclosed are systems and methods for calibrating second and third order intermodulation intercept points of a radio frequency (RF) circuit. One of the methods includes: inputting a two tone RF signal to inputs of the RF circuit to generate a first predetermined amount of third-order intermodulation (IM3) at an output of the RF circuit; adjusting a common-mode voltage (VCM) at one or more nodes of the RF circuit, using a VCM calibration circuit, to reduce the IM3 to a second predetermined level; measuring a second-order intermodulation (IM2) at the output of the RF circuit; and biasing one of a VBP and VBN voltages, using a bulk terminal calibration circuit, of a first bulk terminal of one or more transistors of the RF circuit to reduce the IM2.

The VBP and VBN voltages can be biased independently biasing of each other to reduce IM2. The VCM can be adjusted to have complementary to absolute temperature (CTAT) voltage. This can be done by adjusting the CTAT current, which comprises subtracting a proportional to absolute temperature (PTAT) current from a bandgap current. Additionally, in adjusting the VCM voltage, the VCM should be adjusted such that the voltage noise level is not above the IM3.

One of the systems discloses a calibration circuit for calibrating second and third order intermodulation intercept points of a radio transceiver. The system includes: a common mode voltage (VCM) calibration circuit having a complementary to absolute temperature (CTAT) voltage node coupled to one or more VCM nodes of the radio transceiver, wherein the VCM calibration circuit is configured to adjust the CTAT voltage to reduce a third-order intermodulation (IM3) at an output of the radio transceiver; and a bulk terminal calibration circuit configured to bias one of a VBP and VBN voltages at one or more bulk terminals of one or more transistors of the RF circuit to reduce a second-order intermodulation (IM2).

The VCM calibration circuit can include: a first transistor pair comprising a first NMOS transistor and a second NMOS transistor, wherein gate terminals of the first and second NMOS transistors are coupled to each other; a first current mirror coupling to a drain terminal of the first NMOS transistor to a gate terminal of the second NMOS transistor; a bandgap current source coupled to the drain terminal of the first NMOS transistor; a variable PTAT current source coupled to the drain terminal of the first NMOS transistor; a second transistor pair comprising a first PMOS transistor and a second PMOS transistor; and a second current mirror coupling to a drain terminal of the first PMOS transistor to a gate terminal of the second PMOS transistor; and The gate terminals of the first and second PMOS transistors can be coupled to each other. The source terminals of the first and second PMOS transistors can be coupled to the bandgap current source. And the drain terminal of the second PMOS transistor can be coupled to a resistor to create a voltage node.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes and may not have been selected to delineate or circumscribe the disclosed subject matter.

DISCLOSED ARE METHODS FOR BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies.

The figures and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures to indicate similar or like functionality.

DETAILED DESCRIPTION

Overview

Generally, there are two major categories of mixer, active and passive. The latter type of mixer is usually preferred because of its high linearity performance. Several factors determine the overall performances of passive mixers, they are gain, noise figure and linearity. In addition, modern wireless communication standards, like the 3GPP Long Term Evolution (LTE) standard, require a frequency division duplex (FDD) operation mode, where the receive (RX) and transmit (TX) chains operate at the same time. However, this can cause the inter-modulation of the strong TX signals to leak to the RX input through the duplexer. Minimizing (or even eliminating) inter-modulation is one of the important factors in advanced wireless communications that determine the performance of the mixer.

One of the approaches to remove the jammer leaks from TX output to the RX input is to utilize a surface acoustic wave (SAW) filter right before an active mixer such as a Gilbert-cell mixer. This approach comes at the cost of increased bill-of-materials (BOM), complexity, and high power requirement, all of which are not preferred. Therefore, passive mixers are preferred over active mixers due to their high linearity and relatively low power requirement. Moreover, passive mixers are much less affected by flicker noise since there is no direct current (DC) flowing through the passive mixer. However, these four main factors can negatively affect the linearity performance (e.g., OIP2) of the passive mixer: (1) systematic mismatch due to the layout asymmetry, (2) fabrication or device mismatch, (3) process corners due to the manufacturing variabilities, and (4) temperature variations. Fabrication mismatch can increase second-order intermodulation which reduces the second-order output intercept point (OIP2) performance. Process corners and temperature variations also degrade both second and third-order linearity performances.

A two-tone input signal in a non-ideal receiver generates both second and third-order intermodulation products that can be characterized by OIP2 and third-order output intercept point (OIP3) performances. In the presence of the strong out-of-band jammers leaks from TX to the RX input, very high OIP2 and OIP3 performances are required to avoid a degradation of the signal-to-noise ratio (SNR). Additionally, non-idealities in circuit components can generate voltage threshold and device size mismatch in the mixer switches. Similar to OIP2, OIP3 also degrades with process corners and temperature variations. Accordingly, it is very important to maintain both OIP2 and OIP3 performances over most (if not all) non-idealities sources. This leads to the discussion of calibration methods employed to maintain OIP2 and OIP3 performances. However, existing calibration techniques do not address both OIP2 and OIP3 performances and their maintenance over temperature variations.

One conventional calibration approach is to calibrate OIP2 by adjusting the output symbols to correct OIP2 degradations. This method is used in the Gilbert-cell mixer, which suffers from flicker noise due to the tunable load and poor OIP3. In another conventional approach, OIP2 calibration is performed using unbalanced DC injection on the baseband signal path. However, this may degrade noise performances and produce systematic DC offset in downstream stages of the receiver.

Another very well-known approach consists of adjusting the gate voltage of the mixer switches with fine steps to calibrate the voltage threshold mismatch of the mixer switches. This method requires very fine steps and large digital-to-analog converters (DACs) to achieve the required accuracy, since the OIP2 of the mixer is very sensitive to the gate voltage. However, this may increase the chip area, calibration time, and complexity.

In another conventional approach, the back-gate voltage is calibrated to tune the OIP2 performance, which is not very sensitive to the calibration steps. However, this approach does not address temperature compensation. In fact, none of these conventional approaches calibrate both OIP3 and OIP2 with temperature compensation.

The sensitivity of the receiver is influenced by OIP3 and OIP2 performances. The OIP3 and OIP2 performances should be maintained across the process corners and over temperature variations. Alternatively, OIP2 degradation caused by different factors must be corrected and the performance needs to be maintained over temperature variations to enhance the overall receiver sensitivity. Accordingly, a reliable OIP3 and OIP2 calibration for the passive mixer is required which could maintain the performance over temperature variations.

In this regard, disclosed herein is a novel OIP3 and OIP2 calibration methodology using both gate and bulk terminals of a transistor of a passive mixer. The transistor can be a metal oxide semiconductor field effect transistor (MOSFET). The voltage threshold is directly affected by the change in the bulk to source voltage. In a passive mixer, the source voltage is usually constant where defined by other blocks such as transimpedance amplifier (TIA). Any change in the bulk voltage translates into a change in voltage threshold with a specific coefficient. Flip-well type of transistors are employed in this work with forward body bias (FBB) features that let bulk voltage to run at much higher value. Flip-well N-channel Metal Oxide Semiconductor (NMOS) devices are built on top of N-well layer and separated with additional buried-oxide layer (not shown) which gives better control of the voltage threshold through the bulk terminal unlike conventional-well transistors that build NMOS on top of the P-well which limits bulk voltage due to the diode leakage from P-Well to deep-N-well. In certain flip-well transistors, for 1V change in bulk to source voltage, 70 mV change in voltage threshold is made which is good enough to calibrate any non-idealities related to the mismatch of the voltage threshold.

Figure 1:
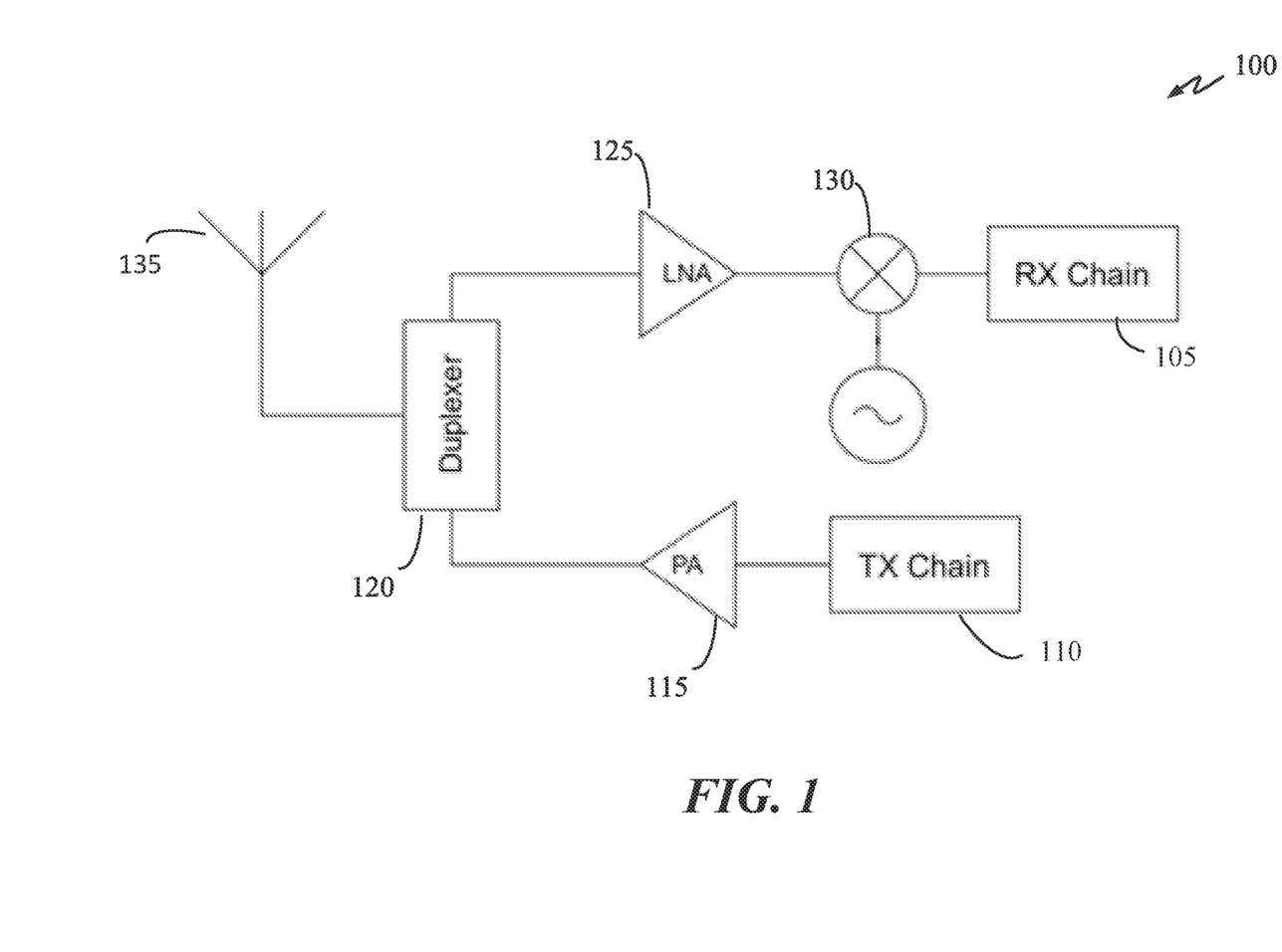
FIG. 1 illustrates a state-of-the art radio transceiver.

FIG. 1 illustrates a state-of-the-art transceiver 100, which includes a receiver chain 105, a transmitter chain 110, a power amplifier 115, a duplexer 120, a LNA 125, and a mixer 130. The the output of transmitter chain 110 is fed to power amplifier 115 where the transmitter output signal is amplified. The amplified signal is then inputted into duplexer 120, which connect the amplified transmitter signal to antenna 135 for transmission. Antenna 135 can be a STAR (simultaneous transmit and receive) antenna that can both transmit and receive.

On the receiving side, LNA 125 is used to increase the amplitude of signals received from antenna 135. The output of LNA 125 is fed to mixer 130, which combine signals from a local oscillator to eliminate the carrier signal from the received Rx signal. After eliminating the carrier signal, the data signal is fed to Rx chain 105 circuit for further amplification and to convert it into a digital signal.

Figure 2:
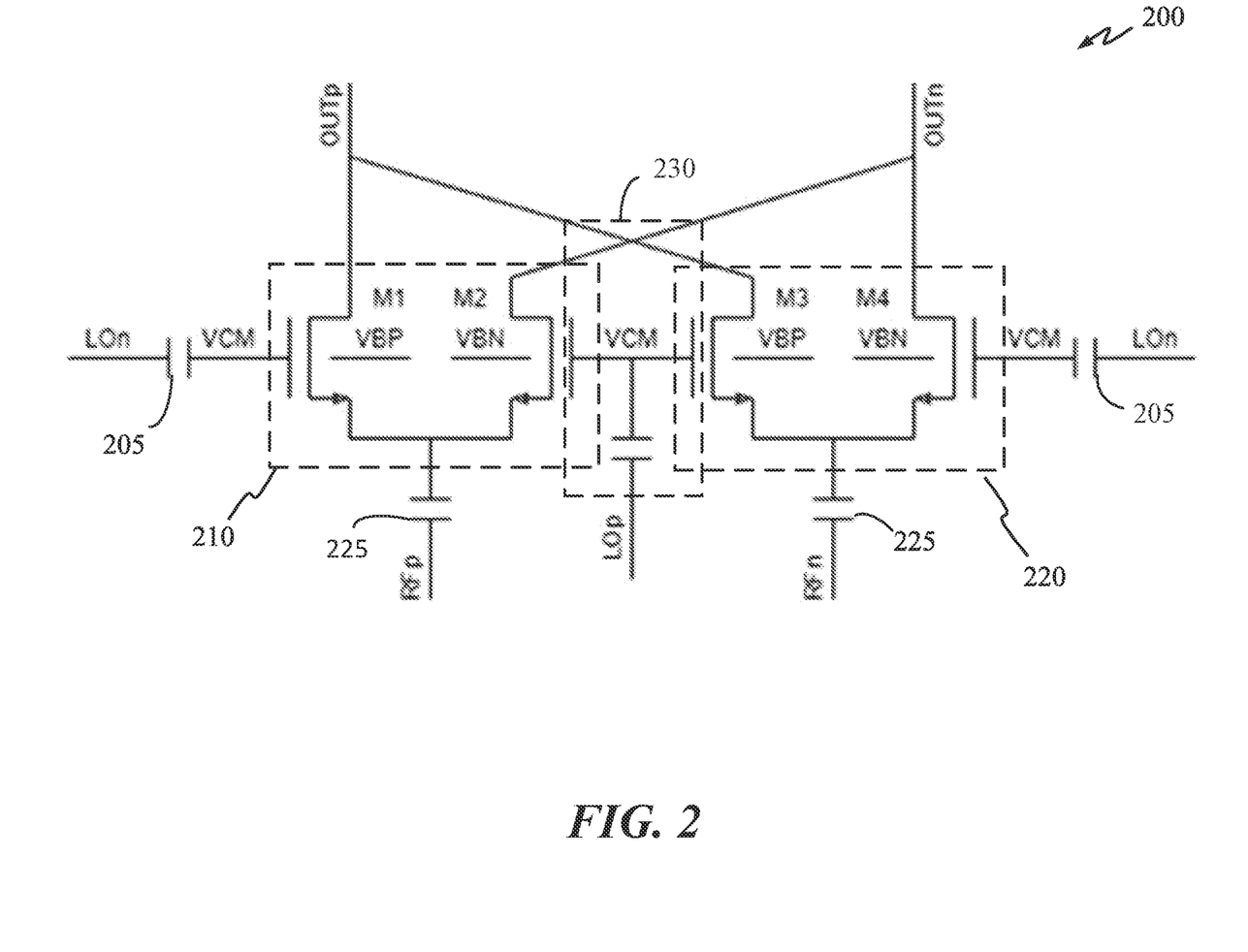
FIG. 2 illustrates a double balanced passive mixer.

FIG. 2. illustrates a mixer 200 in accordance with some embodiments of the present disclosure. Mixer 200 can be implemented with an inventive biasing scheme to achieve high OIP3 and OIP2 performances. In mixer 200, transistors M1 through M4 is configured to receive radio frequency (RF) and local oscillator (LO) signals and to output intermediate frequency (IF) or baseband signals. The differential LO signals are signified by $LO_p$ and $LO_n$. The differential RF signals are signified by $RF_p$ and $RF_n$. Similarly, the differential output signals are $OUT_p$ and $OUT_n$, which have 180-degree phase difference.

AC-coupling capacitors 205 used at the gate of mixer switches 210, 220 are configured to separate DC voltage level of the LO signal. The drain terminal of the M1 and M3 switches are connected and the drain terminal of M2 and M3 are connected. The source of M1 and M2 are connected and are AC-coupled to $RF_p$. Similarly, the source of M3 and M4 are connected and are AC-coupled to $RF_n$. In some embodiments, mixer switches 210, 220 can be implemented using a flip-well NMOS. However, other flip-well types of devices like a P-channel Metal Oxide Semiconductor (PMOS) can also be used. Moreover, the calibration scheme can be used in double balanced passive mixer or any other type of mixer.

Generally, a double balanced mixer is formed by connecting the input and output terminal of two single balanced circuits. In a single balanced mixer, LO feedthrough can be suppressed using another single balanced mixer to form a double balanced mixer. Differential approach of the double balanced mixer has a high immunity to common-mode noises and desirable dynamic range, which are highly preferable for RF circuits. As such, the double balanced mixer is a common RF front-end building block in radio transceivers.

The double-balanced mixer operates with differential LO and RF inputs. By combining two single-balanced mixers, the LO products are prevented from effecting the output. As shown in FIG. 2, the LOs of double-balance mixers are connected in anti-parallel and the RF signals are parallelly coupled. In this way, the converted RF signal is doubled at the output while the LO terms sum to zero at the output.

In this disclosure, a double balance passive mixer with flip-well NMOS type components is used to as the proof of concept. In passive mixers, on resistance ($R_{on}$) plays a significant role to define OIP3 performance. The size of mixer switch along with VCM voltage needs to be well optimized for the certain LO signal and source-drain common-mode voltage, which can be defined by other blocks such as a transimpedance amplifier (TIA), to achieve the optimum OIP3. However, the optimized VCM value only works in a specific process corner and temperature. Accordingly, in some embodiments, the novel calibration process begins with the calibration of the VCM voltage for a specific process corner at room temperature.

At this stage of the calibration, a two-tone test can be performed at the mixer input to generate third-order intermodulation (IM3) products at the mixer output, which are very close to the two-tone applied at the input. Two-tone testing is well known and is used to characterize the non-linearity of active and passive RF components. The two-tone test applies differential signals at the input of the RF device (e.g., mixer). Intermodulation distortion at the mixer output is a result of a non-linear transfer function. Generally, non-idealities of the RF device generates intermodulation in the output signal, which has unwanted frequency components. In the two-tone test, the input power of the difference RF signals can be increased while measuring the slopes of the first and third order IMDs versus the increase in RF input power.

In some embodiments, the VCM voltage level can be calibrated to make sure the IM3 products are reduced to the acceptable values at the mixer output. On the other hand, the VCM value may directly affect the noise performance. Hence, while calibrating VCM voltage value for the optimum OIP3, the noise voltage level needs to be monitored to make sure it will not raise above IM3 components. In this way, the best OIP3 value can be achieved for the specific process corner at the room temperature of 25 degrees Celsius. To maintain the OIP3 performance over the temperature variation, VCM voltage should have complementary to absolute temperature (CTAT) characteristics. The CTAT voltage needs to be characterized to make sure it can track the voltage threshold change due to the temperature variation.

CTAT current may be generated by subtracting a proportional to absolute temperature (PTAT) current from bandgap current. Applying the CTAT current to a resistor generates CTAT voltage that is used to generate VCM voltage and bias the gate of mixer switches. In some embodiments, the VCM voltages of all gates of a mixer are biased simultaneously.

Figure 3:
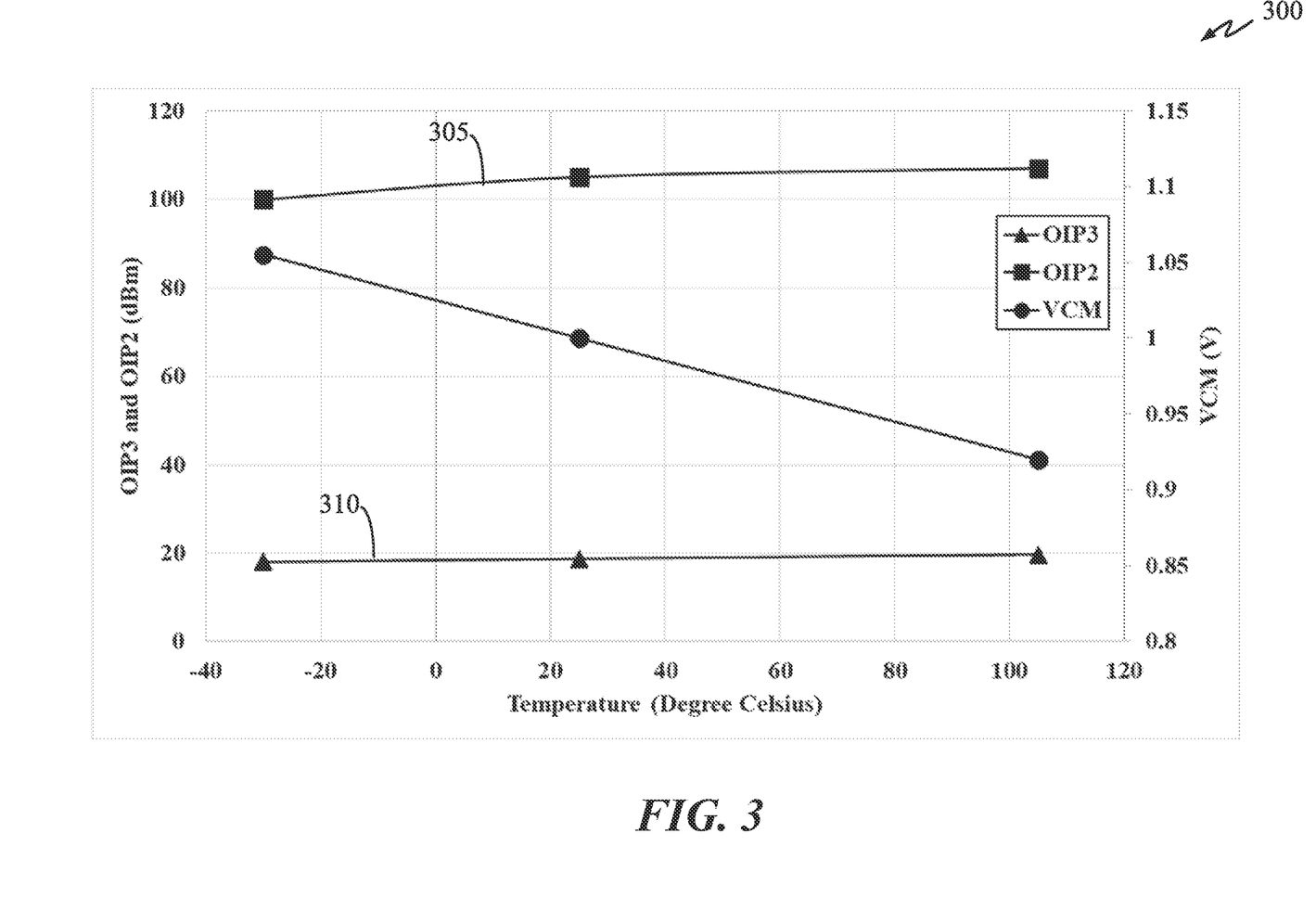
FIG. 3 illustrates is a chart illustrating OIP3 and OIP2 performances of a calibrated transceiver over a range of temperature in accordance with some embodiments of the present disclosure.

The second step is to calibrate second-order intermodulation (IM2) which increases due to the any mismatch factors. In mixer 200, the bulk terminal of the flip-well transistors needs to be calibrated, using VBP and VBN voltages, independently and finely to overcome any mismatch factor to achieve the required OIP2 performance. Smaller VBN and VBP voltage steps leads to a more accurate calibration to achieve higher OIP2 performance. On the other hand, the advantage of OIP2 calibration through the bulk terminal of the mixer switches over the gate terminal is that larger calibration steps can be utilized to achieve the same accuracy and OIP2 performance. In this way, the number of calibration bits can be reduced significantly. Moreover, the temperature compensation of the VCM voltage will not affect the OIP2 performance and both OIP3 and OIP2 performances will be maintained over temperature variations. In some embodiments, two or more bulk terminals FIG. 3 illustrates a chart 300 showing OIP3 (line 310) and OIP2 (line 305) performance over temperature variation of a calibrated mixer 200 using the above disclosed calibration process. Chart 300 shows that gate voltage value (VCM) exhibiting CTAT behavior while maintaining both OIP3 and OIP2 performances over a wide range (−30 to 105 Celsius) of temperature. In some embodiments, for a specific double balance passive mixer, the optimum gate voltage value at room temperature is 1V to achieve the OIP3 of 18.7 dBm. The source and drain voltages are set to 750 mV and peak-to-peak LO voltage is 1V.

To define the VCM voltage, breakdown voltage of the transistor needs to be considered to avoid any reliability issues. In some embodiments, the VBP of 1.05V and VBN of 1V are used to calibrate mismatch factor(s) generated by Monte-Carlo simulation over specific iterations. The calibration achieves the OIP2 performance of 105 dBm at room temperature. Both OIP3 and OIP2 performances are maintained over temperature with minimum degradation with linear VCM of 1.06V to 910 mV over wide temperature range from −30 to 105 degree Celsius. Any OIP3 and OIP2 performances can be achieved depending on the mixer and transistor types; while the goal of this disclosure is to show how OIP3 and OIP2 can be compensated over process corners and temperature variations, the specific VBP and VBN voltages above are just examples for mixer 200. Compared to the state-of-the-art solutions and as shown in FIG. 3, the disclosed calibration methodology can calibrate both OIP3 and OIP2 over a wide range of temperature and process corners.

Figure 4:
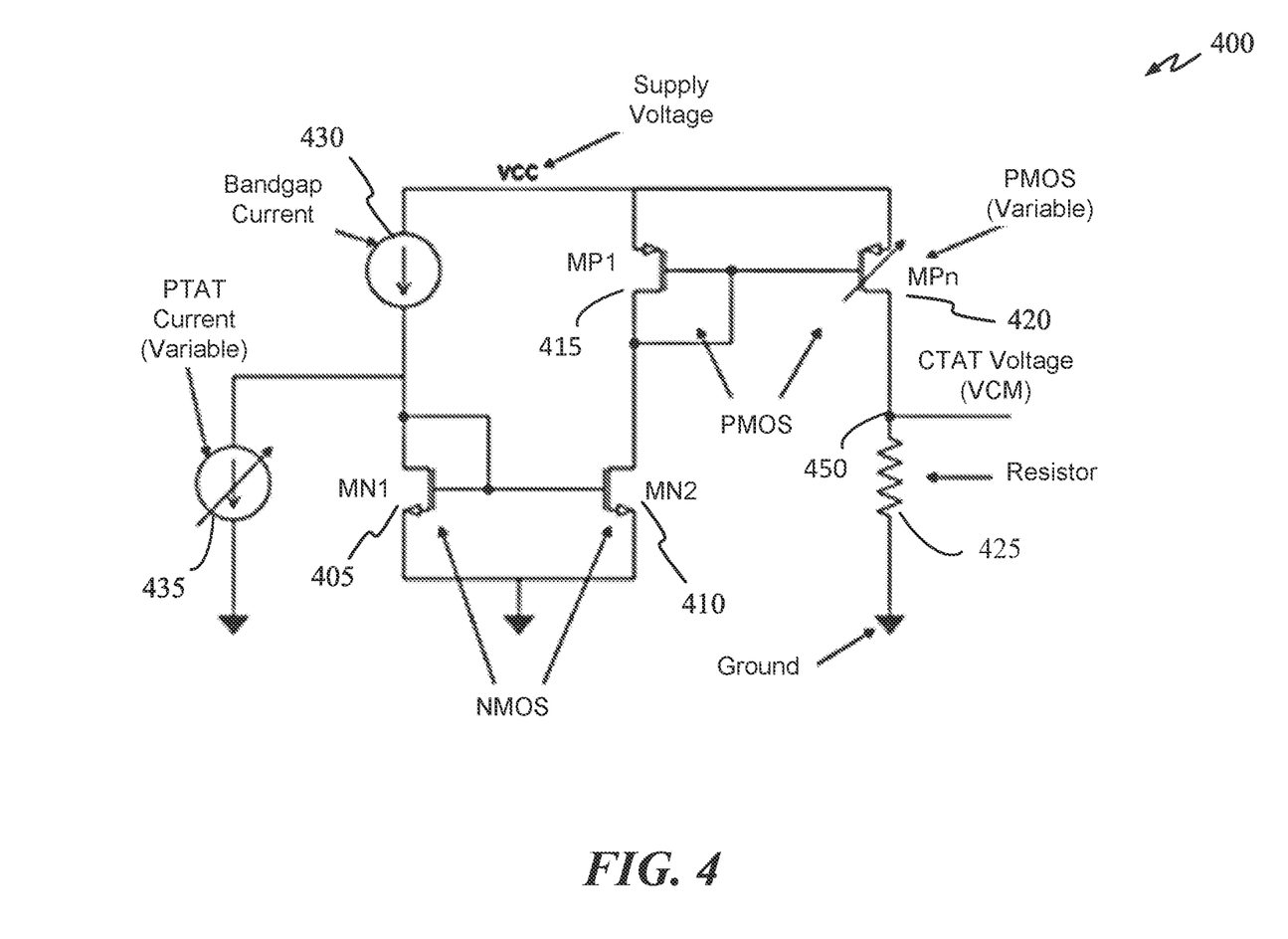
FIG. 4 illustrates a common mode voltage (VCM) calibration circuit in accordance with some embodiments of the present disclosure.

FIG. 4 illustrates a VCM calibration circuit 400 in accordance with some embodiments of the present disclosure. In circuit 400, the bandgap current is constant over temperature (regardless temperature changes and fluctuations). The CTAT current is the PTAT current deducted from the bandgap current, and is mirrored from transistor 405 (MN1) to transistor 410 (MN2) as shown. Circuit 400 is configured to reduce the CTAT current as the temperature increases. Additionally, the CTAT current is then mirrored from transistor 415 (MP1) to variable transistor 420 (MPn). In some embodiments, transistor 415 can also be a variable PMOS.

To calibrate the CTAT voltage (VCM), the current generated by transistor 420 can be varied until the desired output current is reached. The current from transistor 420 is then converted to a CTAT voltage by resistor 425.

Calibration circuit 400 includes a first pair of NMOS 405, 410 coupled at their gate terminals. The first pair of NMOS 405, 410 includes a current mirror that connects the drain voltage of NMOS 405 to gate voltage of NMOS 405 and 410. The current mirror produces a copy of the current flowing into or out of an input terminal by replicating the current in an output terminal. Calibration circuit 400 also includes current sources 430 and 435. Current source 430 can be a bandgap current source, which the drain terminal of transistor 405. Current source 435 can be a variable current source, which can also be coupled to the drain terminal of transistor 405. Current source 435 can be a PTAT current, which deducts bandgap current 430 as configured.

Calibration circuit 400 can also includes a second pair of transistors 415, 420, which includes has current mirror to mirror the current from transistor 415 to transistor 420. The second pair of transistors 415, 420 can be PMOS transistors. The drain terminal of PMOS transistor 415 is coupled to the drain of NMOS transistor 410 while the source terminal of PMOS transistor 415 is coupled to current source 430. In some embodiments, VCM node 450 of calibration circuit 400 can be coupled to one or more VCM nodes of mixer 200. In this way, calibration circuit 400 can be used to calibrate the VCM of mixer 200.

Figure 5:
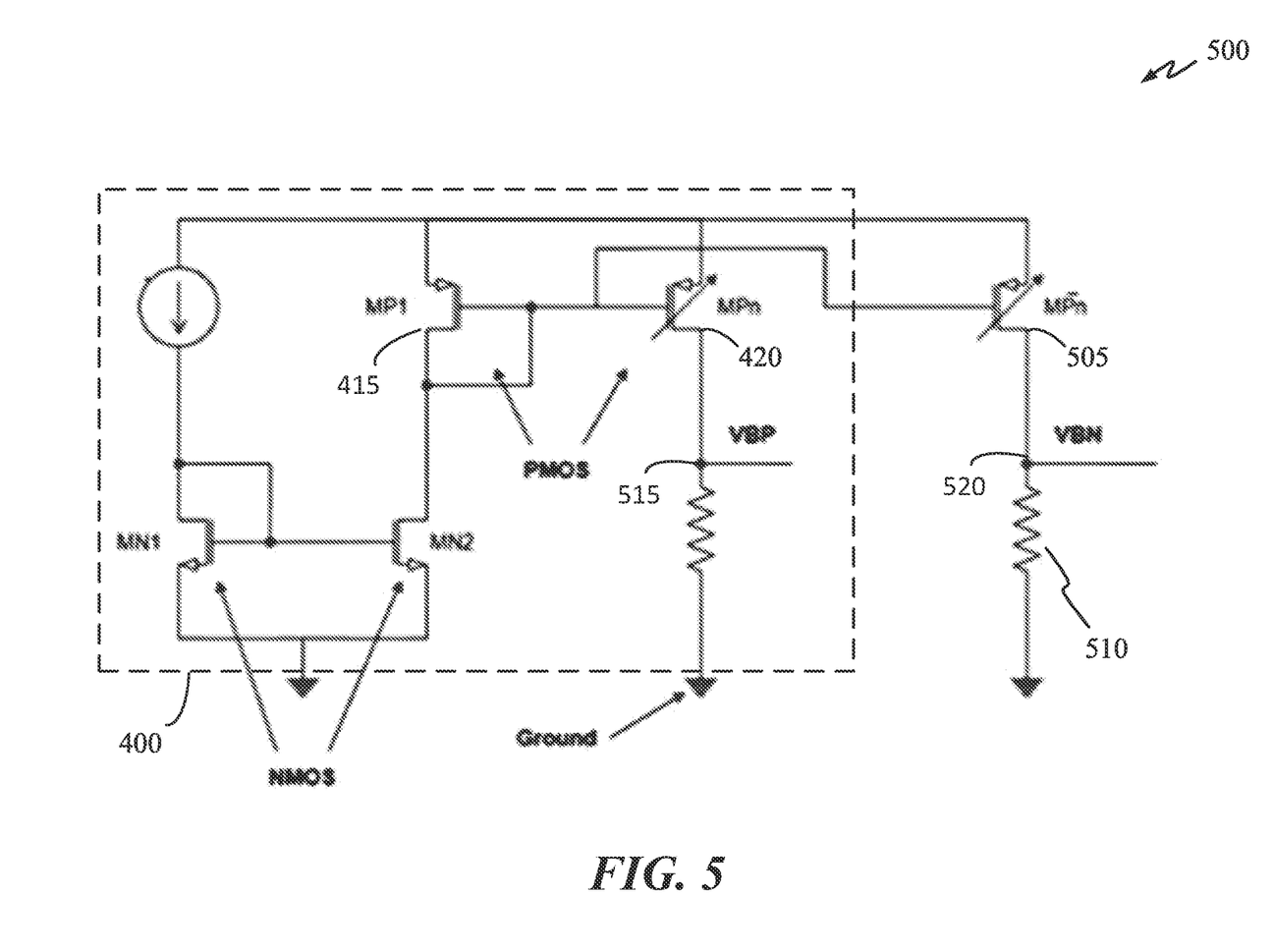
FIG. 5 illustrates a bulk terminal calibration circuit in accordance with some embodiments of the present disclosure.

FIG. 5 illustrates a VBP-VBN calibration circuit 500 in accordance with some embodiments of the present disclosure. Calibration circuit 500 can include one or more components of calibration circuit 400. For example, calibration circuit 500 can include all components of calibration circuit 400 except for the variable current source 435. In some embodiments, calibration circuit 500 includes a third transistor 505 with the gate terminal coupled to the gate terminals of transistors 415 and 420. The drain terminal of transistor 505 can be coupled to resistor 510, and the source terminal can be coupled to the source terminals of transistors 415 and 420. Transistor 505 can be a PMOS transistor. Calibration circuit 500 can also be referred to as a bulk terminal calibration circuit.

In calibration circuit 500 (unlike in circuit 400), the PTAT current is not deducted from the bandgap current. Using circuit 500, mismatch non-idealities in mixer switches (e.g., mixer 200) can be significantly reduced or eliminated by calibrating the mixer's VBP and VBN. This can be done by biasing VBP and VBN independently. In some embodiments, transistors 405, 410, 415, 420, and 505 can be CMOS transistors, but they can be any type of transistors can be also used. In some embodiments, VBP and VBN nodes of calibration circuit 500 can be coupled to one or more VBP and VBN nodes of mixer 200. In this way, calibration circuit 500 can be used to calibrate the VBP and VBN of mixer 200—simultaneously or asynchronously.

Figure 6:
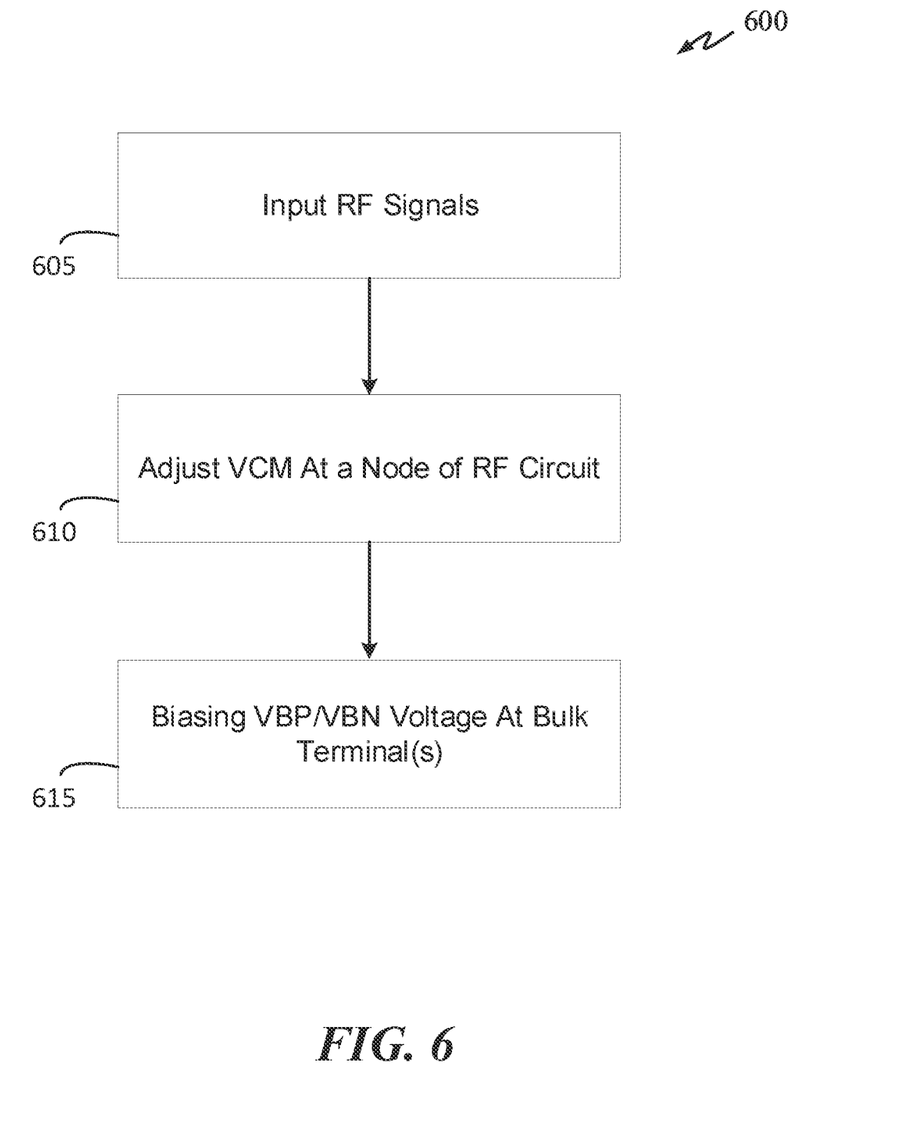
FIG. 6 illustrates a calibration process 600 in accordance with some embodiments of the present disclosure.

FIG. 6 illustrates a calibration process 600 for calibrating a radio transceiver in accordance with some embodiments of the present disclosure. Process 600 starts at 605 where a two-tone RF signal is inputted into the input of the radio transceiver (or other RF circuits). In some embodiments, the power of the RF signals can be adjusted to yield the highest possible IM3 for the particular two-tone RF signals. At 610, the VCM at one or more nodes of the radio transceiver can be calibrated until the IM3 level is lowered to the desired level. In some embodiments, the VCM of the gate terminals are calibrated. The calibration can be done with (for example) VCM calibration circuit 400. At 615, the VBP and/or VBN voltage is calibrated at the bulk terminal each transistor using, for example, bulk terminal calibration circuit 500.

CONCLUSION

One or more of the components, steps, features, and/or functions illustrated in the figures may be rearranged and/or combined into a single component, block, feature or function or embodied in several components, steps, or functions. Additional elements, components, steps, and/or functions may also be added without departing from the disclosure. The apparatus, devices, and/or components illustrated in the Figures may be configured to perform one or more of the methods, features, or steps described in the Figures. The algorithms described herein may also be efficiently implemented in software and/or embedded in hardware.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the following detailed description are presented in terms of algorithms and symbolic representations of operations on data bits within a computer memory. These algorithmic descriptions and representations are the methods used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared or otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following disclosure, it is appreciated that throughout the disclosure terms such as "processing," "computing," "calculating," "determining," "displaying" or the like, refer to the action and processes of a computer system, or similar electronic computing device, that manipulates and transforms data represented as physical (electronic) quantities within the computer system's registers and memories into other data similarly represented as physical quantities within the computer system's memories or registers or other such information storage, transmission or display.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. It will be appreciated that a variety of programming languages may be used to implement the teachings of the invention as described herein.

The figures and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures to indicate similar or like functionality.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present invention be limited not by this detailed description, but rather by the claims of this application. As will be understood by those familiar with the art, the present invention may be embodied in other specific forms without departing from the spirit or essential characteristics thereof. Likewise, the particular naming and division of the modules, routines, features, attributes, methodologies and other aspects are not mandatory or significant, and the mechanisms that implement the present invention or its features may have different names, divisions and/or formats.

Furthermore, as will be apparent to one of ordinary skill in the relevant art, the modules, routines, features, attributes, methodologies and other aspects of the present invention can be implemented as software, hardware, firmware or any combination of the three. Also, wherever a component, an example of which is a module, of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of ordinary skill in the art of computer programming.

Additionally, the present invention is in no way limited to implementation in any specific programming language, or for any specific operating system or environment. Accordingly, the disclosure of the present invention is intended to be illustrative, but not limiting, of the scope of the present invention, which is set forth in the following claims.

The invention claimed is:

1. A method for calibrating second and third order intermodulation intercept points of a radio frequency (RF) circuit, the method comprising:
    inputting a two tone RF signal to inputs of the RF circuit to generate a first predetermined amount of third-order intermodulation (IM3) at an output of the RF circuit;
    adjusting a common-mode voltage (VCM) at one or more nodes of the RF circuit, using a VCM calibration circuit, to reduce the IM3 to a second predetermined level;
    measuring a second-order intermodulation (IM2) at the output of the RF circuit; and
    biasing one of a VBP and VBN voltages, using a bulk terminal calibration circuit, of a first bulk terminal of one or more transistors of the RF circuit to reduce the IM2.

2. The method of claim 1, wherein biasing one of the VBP and VBN voltages comprises independently biasing both the VBP and VBN voltages to reduce the IM2.

3. The method of claim 1, wherein the VCM is adjusted to have complementary to absolute temperature (CTAT) voltage.

4. The method of claim 3, wherein the CTAT voltage comprises a CTAT current component, wherein the CTAT current component comprises subtracting a proportional to absolute temperature (PTAT) current from a bandgap current.

5. The method of claim 4, wherein the VCM calibration circuit comprises:
    a first transistor pair comprising a first NMOS transistor and a second NMOS transistor, wherein gate terminals of the first and second NMOS transistors are coupled to each other;
    a first current mirror coupling to a drain terminal of the first NMOS transistor to a gate terminal of the second NMOS transistor;
    a bandgap current source coupled to the drain terminal of the first NMOS transistor;
    a variable PTAT current source coupled to the drain terminal of the first NMOS transistor;
    a second transistor pair comprising a first PMOS transistor and a second PMOS transistor, wherein gate terminals of the first and second PMOS transistors are coupled to each other;
    a second current mirror coupling to a drain terminal of the first PMOS transistor to a gate terminal of the second PMOS transistor; and
    wherein source terminals of the first and second PMOS transistors are coupled to the bandgap current source, wherein a drain terminal of the second PMOS transistor is coupled to a resistor.

6. The method of claim 4, the bulk terminal calibration circuit comprises:
    a first transistor pair comprising a first NMOS transistor and a second NMOS transistor, wherein gate terminals of the first and second NMOS transistors are coupled to each other;
    a first current mirror coupling to a drain terminal of the first NMOS transistor to a gate terminal of the second NMOS transistor;
    a bandgap current source coupled to the drain terminal of the first NMOS transistor;
    a variable PTAT current source coupled to the drain terminal of the first NMOS transistor;

a second transistor pair comprising a first PMOS transistor and a second PMOS transistor, wherein gate terminals of the first and second PMOS transistors are coupled to each other;

a second current mirror coupling to a drain terminal of the first PMOS transistor to a gate terminal of the second PMOS transistor;

wherein source terminals of the first and second PMOS transistors are coupled to the bandgap current source, wherein a drain terminal of the second PMOS transistor is coupled to a first resistor to form a VBP node; and a third PMOS transistor, wherein a gate terminal of the third PMOS transistor is coupled to gate terminals of the first and second NMOS transistors, wherein a source terminal of the third PMOS transistor is coupled to gate terminals of the first and second NMOS transistors, wherein a drain terminal of the third PMOS transistor is coupled to a second resistor to form a VBN node.

7. The method of claim 1, wherein adjusting a common-mode voltage (VCM) comprises adjusting the VCM such that a noise level of the VCM is not above the IM3.

8. The method of claim 1, wherein biasing the VBP voltage comprises setting VBP at 1.05 volts to calibrate mismatching factors generated by Monte-Carlo simulation over a plurality of iterations.

9. The method of claim 1, wherein biasing the VBN voltage comprises setting VBN at 1.0 volts to calibrate mismatching factors generated by Monte-Carlo simulation over a plurality of iterations.

10. The method of claim 1, wherein adjusting the common-mode voltage comprises adjusting the VCM at a gate terminal of one or more transistors.

11. A calibration circuit for calibrating second and third order intermodulation intercept points of a radio transceiver, the calibration circuit comprising:

a common mode voltage (VCM) calibration circuit having a complementary to absolute temperature (CTAT) voltage node coupled to one or more VCM nodes of the radio transceiver, wherein the VCM calibration circuit is configured to adjust the CTAT voltage to reduce a third-order intermodulation (IM3) at an output of the radio transceiver; and a bulk terminal calibration circuit configured to bias one of a VBP and VBN voltages at one or more bulk terminals of one or more transistors of the RF circuit to reduce a second-order intermodulation (IM2).

12. The calibration circuit of claim 11, wherein the VCM calibration circuit comprises:

a first transistor pair comprising a first NMOS transistor and a second NMOS transistor, wherein gate terminals of the first and second NMOS transistors are coupled to each other;

a first current mirror coupling to a drain terminal of the first NMOS transistor to a gate terminal of the second NMOS transistor;

a bandgap current source coupled to the drain terminal of the first NMOS transistor;

a variable PTAT current source coupled to the drain terminal of the first NMOS transistor;

a second transistor pair comprising a first PMOS transistor and a second PMOS transistor, wherein gate terminals of the first and second PMOS transistors are coupled to each other;

a second current mirror coupling to a drain terminal of the first PMOS transistor to a gate terminal of the second PMOS transistor; and wherein source terminals of the first and second PMOS transistors are coupled to the bandgap current source, wherein a drain terminal of the second PMOS transistor is coupled to a resistor.

13. The calibration circuit of claim 11, the bulk terminal calibration circuit comprises:

a first transistor pair comprising a first NMOS transistor and a second NMOS transistor, wherein gate terminals of the first and second NMOS transistors are coupled to each other;

a first current mirror coupling to a drain terminal of the first NMOS transistor to a gate terminal of the second NMOS transistor;

a bandgap current source coupled to the drain terminal of the first NMOS transistor;

a variable PTAT current source coupled to the drain terminal of the first NMOS transistor;

a second transistor pair comprising a first PMOS transistor and a second PMOS transistor, wherein gate terminals of the first and second PMOS transistors are coupled to each other;

a second current mirror coupling to a drain terminal of the first PMOS transistor to a gate terminal of the second PMOS transistor;

wherein source terminals of the first and second PMOS transistors are coupled to the bandgap current source, wherein a drain terminal of the second PMOS transistor is coupled to a first resistor to form a VBP node; and a third PMOS transistor, wherein a gate terminal of the third PMOS transistor is coupled to gate terminals of the first and second NMOS transistors, wherein a source terminal of the third PMOS transistor is coupled to gate terminals of the first and second NMOS transistors, wherein a drain terminal of the third PMOS transistor is coupled to a second resistor to form a VBN node.

14. The calibration circuit of claim 11, wherein the CTAT voltage comprises a CTAT current component, wherein the CTAT current component comprises subtracting a proportional to absolute temperature (PTAT) current from a bandgap current.

15. The calibration circuit of claim 11, wherein the bulk terminal calibration is configured to bias the VBP voltage by setting VBP at 1.05 volts to calibrate mismatching factors generated by Monte-Carlo simulation over many iterations.

16. The calibration circuit of claim 11, wherein the bulk terminal calibration is configured to bias the VBN voltage by setting VBN at 1.0 volts to calibrate mismatching factors generated by Monte-Carlo simulation over a plurality of iterations.

17. The calibration circuit of claim 11, wherein the one or more VCM nodes of the radio transceiver comprise gate terminals of transistors of the radio transceiver.

\* \* \* \* \*